United States Patent
Baek et al.

(10) Patent No.: US 10,389,384 B2
(45) Date of Patent: Aug. 20, 2019

(54) DATA COMMUNICATION METHOD AND APPARATUS USING FORWARD ERROR CORRECTION

(71) Applicant: SAMSUNG ELECTRONICS CO., LTD., Suwon-si (KR)

(72) Inventors: Yun-sun Baek, Suwon-si (KR); Yong-tae Kim, Suwon-si (KR); Jae-han Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 14/225,063

(22) Filed: Mar. 25, 2014

(65) Prior Publication Data

US 2014/0304570 A1  Oct. 9, 2014

Related U.S. Application Data

(60) Provisional application No. 61/804,824, filed on Mar. 25, 2013.

(30) Foreign Application Priority Data

Apr. 25, 2013  (KR) .......................... 10-2013-0046216

(51) Int. Cl.
*H03M 13/13*  (2006.01)
*H04L 1/00*  (2006.01)
(Continued)

(52) U.S. Cl.
CPC .......... *H03M 13/13* (2013.01); *H04L 1/0075* (2013.01); *H04L 1/1812* (2013.01);
(Continued)

(58) Field of Classification Search
CPC ... H04L 1/0057; H04L 1/0009; H04L 1/0643; H04L 1/0002; H04L 1/0007;
(Continued)

(56) References Cited

U.S. PATENT DOCUMENTS 7,409,627 B2  8/2008  Kim et al.
8,311,122 B2  11/2012  Kure et al.
(Continued)

FOREIGN PATENT DOCUMENTS

CN  101171644 A  4/2008
CN  102017508 A  4/2011
(Continued)

OTHER PUBLICATIONS

Communication issued Jun. 16, 2014 by the International Searching Authority in counterpart International Patent Application No. PCT/KR2014/002070.
(Continued)

*Primary Examiner* — April Y Blair
*Assistant Examiner* — Sazzad Hossain
(74) *Attorney, Agent, or Firm* — Sughrue Mion, PLLC

(57) ABSTRACT

A data communication method using forward error correction (FEC) includes: receiving at least one of symbols that constitute one encoding block unit; extracting information related to parameters that adjust an FEC encoding rate from the at least one symbol; determining whether an error may be corrected based on the extracted information related to the parameters and a number of symbols with errors from among the symbols that constitute the encoding block unit; and transmitting feedback information related to the symbols prior to the symbols that constitute the encoding block unit being completely received based on the determination of whether an error may be corrected.

13 Claims, 4 Drawing Sheets

(51) Int. Cl.
  *H04L 1/18* (2006.01)
  *H03M 13/29* (2006.01)
  *H04L 1/06* (2006.01)
  *H03M 13/25* (2006.01)
(52) U.S. Cl.
  CPC ......... *H04L 1/1854* (2013.01); *H03M 13/255* (2013.01); *H03M 13/2906* (2013.01); *H04L 1/0002* (2013.01); *H04L 1/0007* (2013.01); *H04L 1/0009* (2013.01); *H04L 1/0057* (2013.01); *H04L 1/0643* (2013.01)
(58) Field of Classification Search
  CPC ... H04L 1/0075; H04L 1/1854; H04L 1/1812; H03M 13/255; H03M 13/2906; H03M 13/13
  USPC .............. 370/216; 375/240.27; 714/752, 776
  See application file for complete search history.

(56) References Cited

U.S. PATENT DOCUMENTS

| | | | |
|---|---|---|---|
| 8,787,384 B2 | 7/2014 | Palanki | |
| 8,826,102 B2* | 9/2014 | Liu et al. | ............... 714/774 |
| 2004/0120349 A1 | 6/2004 | Border et al. | |
| 2005/0138521 A1* | 6/2005 | Suzuki | ............... H04B 7/18582 714/755 |
| 2005/0276259 A1* | 12/2005 | Nakabayashi | ........ H04L 1/0009 370/349 |
| 2006/0104370 A1 | 5/2006 | Yamanaka et al. | |
| 2006/0150055 A1 | 7/2006 | Quinard et al. | |
| 2006/0245384 A1 | 11/2006 | Talukdar et al. | |
| 2007/0220406 A1* | 9/2007 | Gubbi | ............... H03M 13/1515 714/776 |
| 2008/0010582 A1 | 1/2008 | Nieto et al. | |
| 2009/0010368 A1 | 1/2009 | Proctor, Jr. | |
| 2009/0227211 A1* | 9/2009 | Hoshino | .............. H04W 52/262 455/69 |
| 2009/0274139 A1 | 11/2009 | Palanki | |
| 2010/0309793 A1* | 12/2010 | Choi | ..................... H04L 1/0016 370/252 |
| 2011/0149916 A1 | 6/2011 | Kwak et al. | |
| 2012/0005549 A1* | 1/2012 | Ichiki | .................. H03M 13/353 714/748 |
| 2012/0011413 A1* | 1/2012 | Liu | ....................... H04L 1/0009 714/746 |
| 2012/0250762 A1* | 10/2012 | Kaye | .................... H04N 19/164 375/240.07 |
| 2013/0238960 A1* | 9/2013 | Shen | ....................... G06F 11/10 714/776 |

FOREIGN PATENT DOCUMENTS

JP        4883076 B2   2/2012
WO    WO 2009134220 A1 * 11/2009   ........... H04L 1/0009

OTHER PUBLICATIONS

Communication dated Sep. 21, 2017, issued by the European Patent Office in counterpart European Patent Application No. 14161132.7.
Communication dated Jan. 10, 2018, from the State Intellectual Property Office of People's Republic of China in counterpart Application No. 201410114937.1.

* cited by examiner

DATA COMMUNICATION METHOD AND APPARATUS USING FORWARD ERROR CORRECTION

RELATED APPLICATIONS

This application claims benefit from U.S. Provisional Patent Application No. 61/804,824, filed on Mar. 25, 2013, in the U.S. Patent and Trademark Office and priority from Korean Patent Application No. 10-2013-0046216, filed on Apr. 25, 2013, in the Korean Intellectual Property Office, the disclosures of which are incorporated herein in their entireties by reference.

BACKGROUND

1. Technical Field

One or more exemplary embodiments relate to a method and apparatus for performing data communication according to a network state. More particularly, the exemplary embodiments relate to a method and apparatus for performing data communication by using forward error correction (FEC).

2. Description of the Related Art

As use of mobile devices has considerably increased, data communication using a wireless network, such as WiFi, has also greatly increased. Since a wireless network is greatly affected by a use environment, the possibility of occurrence of packet loss is high.

Examples of technologies for correcting a packet error and compensating for packet loss in data communication through a wireless network include forward error correction (FEC) and automatic repeat request (ARQ). Although ARQ ensures high reliability of data transmission, ARQ has a problem in that when a packet error or a packet loss occurs, retransmission of a lost packet has to be requested, thereby delaying communication. Accordingly, FEC or ARQ is selectively used according to a network condition. FEC refers to a method of detecting a data error and encoding and transmitting data to be corrected by using a transmitting device. In particular, application layer (AL)-FEC for correcting a packet error and compensating for a packet loss has recently been widely used in an application layer. In order to maintain FEC compatibility between sessions, a standard transmission/reception framework for FEC exists and many FEC methods are used. However, the currently used FEC methods present difficulties in adjusting an FEC rate in real time.

SUMMARY

One or more exemplary embodiments include a method and apparatus for performing data communication by adjusting a forward error correction (FEC) rate based on a network state.

Additional aspects will be set forth in part in the description which follows and, in part, will be apparent from the description, or may be learned by practice of the exemplary embodiments.

According to one aspect of the exemplary embodiments, a data communication method using forward error correction (FEC) includes: receiving at least one of symbols that constitute one encoding block unit; extracting information related to parameters that adjust an FEC encoding rate from the at least one symbol; determining whether an error may be corrected based on the extracted information related to the parameters and a number of symbols with errors from among the symbols that constitute the encoding block unit; and transmitting feedback information related to the symbols before the symbols that constitute the encoding block unit are completely received, based on the determination.

The information related to the parameters may include encoding block unit length information.

The symbols that constitute the encoding block may include at least one source symbol and at least one repair symbol.

The information related to the parameters may further include source block length information and symbol length information.

The information related to the parameters may be included in a header of the repair symbol.

The information related to the parameters may be included in a real time protocol (RTP) header of the at least one source symbol.

The FEC may be Reed Solomon (RS)-FEC.

The feedback information may include at least one of a retransmission request of the symbols of the encoding block unit or channel site information.

According to another aspect of the exemplary embodiments, a computer-readable recording medium has embodied thereon a program for executing the data communication method.

According to another aspect of the exemplary embodiments, a data communication method using forward error correction (FEC) includes: determining parameters that adjust an FEC encoding rate; and generating symbols that constitute an encoding block unit according to the determined parameters, wherein information related to the parameters is included in at least one of the symbols, and includes encoding block unit length information.

The data communication method may further include: receiving feedback information from a receiving device; and changing the parameters that are currently set based on the received feedback information, or retransmitting the symbols that constitute the encoding block unit.

The symbols that constitute the encoding block unit may include at least one source symbol and at least one repair symbol.

The information related to the parameters may further include source block length information and symbol length information.

The information related to the parameters may be included in a header of the at least one repair symbol.

The information related to the parameters may be included in a real time protocol (RTP) header of the at least one source symbol.

The FEC may be Reed Solomon (RS)-FEC.

According to another aspect of the exemplary embodiments, a computer-readable recording medium has embodied thereon a program for executing the data communication method According to another aspect of the exemplary embodiments, a data communication apparatus using forward error correction (FEC) includes: a receiver that is configured to receive at least one of symbols that constitute one encoding block unit; a parameter information extractor that is configured to extract information related to parameters that adjust an FEC encoding rate from the at least one symbol; an error determiner configured to determine whether an error may be corrected based on the extracted information related to the parameters and a number of symbols with errors from among the symbols that constitute the encoding block unit; and a feedback information transmitter configured to transmit feedback information related to the symbols before the symbols that constitute the encoding block unit are completely received based on the determination.

The information related to the parameters may include encoding block unit length information.

The symbols that constitute the encoding block unit may include at least one source symbol and at least one repair symbol.

The information related to the parameters may further include source block length information and symbol length information.

The information related to the parameters may be included in a header of the at least one repair symbol.

The information related to the parameters may be included in a real time protocol (RTP) header of the at least one source symbol.

The FEC may be Reed Solomon (RS)-FEC.

The feedback information may include at least one of a retransmission request of the symbols that constitute the encoding block unit or channel state information.

According to another aspect of the exemplary embodiments, a data communication apparatus using forward error correction (FEC) includes: a parameter determiner configured to determine parameters that adjust an FEC encoding rate; and a symbol generator configured to generate symbols that constitute an encoding block unit according to the determined parameters, wherein information related to the parameters is included in at least one of the symbols, and includes encoding block unit length information.

The parameter determiner may further include a feedback receiver, wherein the feedback receiver is configured to receiver feedback information from a receiving device, and changes the parameters that are currently set based on the received feedback information or retransmits the symbols that constitute the encoding block unit.

The symbols that constitute the encoding block unit may include at least one source symbol and at least one repair symbol.

The information related to the parameters may further include source block length information and symbol length information.

The information related to the parameters may be included in a header of the at least one repair symbol.

The information related to the parameters may be included in a real time protocol (RTP) header of the at least one source symbol.

The FEC may be a Reed Solomon (RS)-FEC.

An aspect of an exemplary embodiment may provide a data communication apparatus using forward error correction (FEC), the data communication apparatus including: a receiver configured to receive at least one of symbols that constitute one encoding block unit; a parameter information extractor configured to extract information from the at least one symbol; an error determiner configured to determine whether an error may be corrected based on the extracted information; and a feedback information transmitter configured to transmit feedback information related to the at least one symbol.

The extracted information may be related to parameters that adjust an FEC encoding rate.

The determination of whether an error may be corrected may be related to the parameters and a number of symbols with errors from among the symbols that constitute the encoding block unit.

The feedback information may be configured to be transmitted prior to the symbols that constitute the encoding block unit being completely received based on the determination.

The symbols that constitute the encoding block unit may include at least one source symbol and at least one repair symbol.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF THE EXEMPLARY EMBODIMENTS

Figure 1:
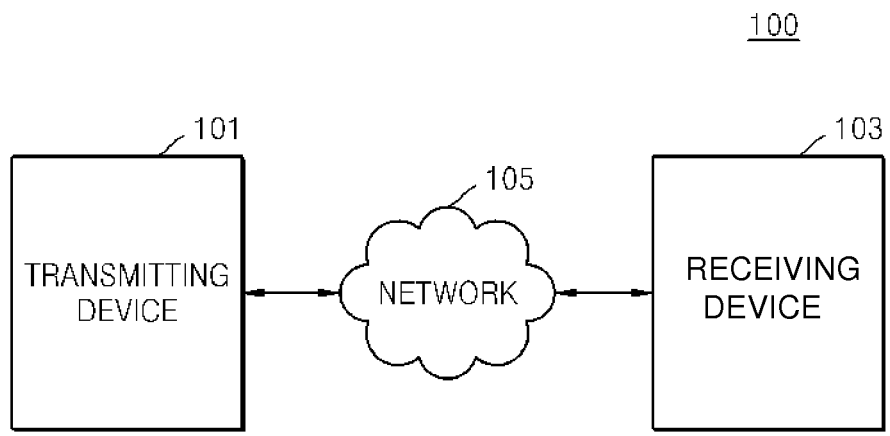
FIG. 1 is a block diagram which illustrates a data communication system according to an exemplary embodiment.

Reference will now be made in detail to the exemplary embodiments, examples of which are illustrated in the accompanying drawings, wherein like reference numerals refer to like elements throughout. In the drawings, sizes of elements may be exaggerated for clarity. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram which illustrates a data communication system 100 according to an exemplary embodiment.

A transmitting device 101 transmits/receives data through a network 105 to/from a receiving device 103. Examples of the transmitting device 101 of FIG. 1 may include, but are not limited to, devices that perform data communication, for example, a desktop, a mobile phone, a personal digital assistant (PDA), a server and a laptop. Examples of the receiving device 103 may include, but are not limited to, devices that may transmit/receive data through the network 105, for example, a desktop, a server, a mobile phone, a PDA, a server and a laptop.

Examples of the network 105 of FIG. 1 include a wired network and a wireless network. In particular, a wireless network has a higher risk of error than a wired network because in a wired network a condition is changed due to signal interference, attenuation, or fading. The term 'error' used herein may include not only a data error but also a data loss in any type of data communication. In other words, the term 'error' may include not only a case where part of data such as a packet is incorrect but also a case where data transmitted by the transmitting device 101 is not arrived at the receiving device 103.

In response to data being transmitted/received between the transmitting device 101 and the receiving device 103 through the network 105, a packet loss may occur as a result of a network condition. Although there are many methods of dealing with a packet loss, FIG. 1 provides a method of detecting whether an error and a loss occur by using a packet error receiving device and determining whether the error and the loss may be corrected/recovered by using forward error correction (FEC).

FEC encoding is roughly classified into block encoding and convolutional encoding. Block encoding is a method in which the receiving device 103 detects an error in response to the transmitting device 101 adding a parity bit to data for error detection, correction, and recovery of data and transmits the data. Examples of block encoding include Hamming encoding, cirlcic redundancy (CRC) encoding, and BCH encoding, such as Reed Solomon (RS) encoding. Block encoding is well known to one of ordinary skill in the art, and thus a detailed explanation thereof will not be provided. Convolutional encoding is a method of transmitting one bit as a plurality of bits. Examples of convolutional encoding include self-orthogonal encoding, Wyner encoding, and Viterbi encoding. Convolutional encoding is also well known to one of ordinary skill in the art, and thus a detailed explanation thereof will not be provided.

According to an exemplary embodiment, FEC is a method of dividing data into source symbols and determining the number of repair symbols that are generated per a certain number of source symbols. The term TEC encoding rate' may refer to the number of repair symbols that are generated per a certain number of source symbols. For example, the term TEC encoding rate' may be referred to as, but is not limited to, an FEC rate.

In FEC of the related art, it is difficult to directly adjust an FEC encoding rate according to a network condition. That is, since it is difficult to adjust an FEC encoding rate during data communication, a bandwidth of a network may be inefficiently used, and a packet recovery time may be delayed or recovery may fail, thereby degrading a service quality and increasing user inconvenience.

However, according to an exemplary embodiment, in data communication using FEC, since parameters for adjusting an encoding rate are transmitted to the receiving device 103, an FEC encoding rate is adjusted according to a network condition and feedback information is quickly received from the receiving device 103.

Figure 2:
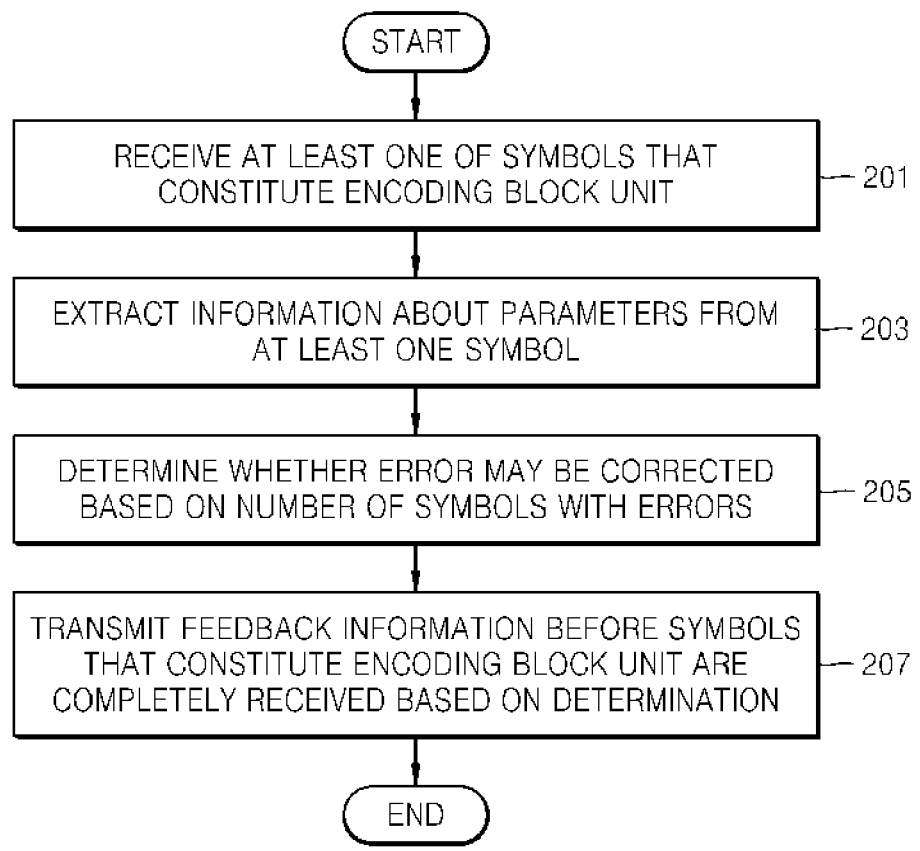
FIG. 2 is a flowchart which illustrates a method of receiving data by using forward error correction (FEC), according to an exemplary embodiment.

FIG. 2 is a flowchart which illustrates a method of receiving data by using FEC, according to an exemplary embodiment.

Referring to FIG. 2, a transmitting device divides or packetizes data into source symbols. Also, an encoding block unit may include a unit that is FEC encoded and includes source symbols and repair symbols.

In other words, the encoding block may include a unit including both source symbols and generated repair symbols. The number of the source symbols and the repair symbols in the encoding block units is referred to as an encoding block length, and is generally denoted by n in FEC. The exemplary embodiment is not limited to the number of the source symbols and the repair symbols, and a total amount of data in the encoding block unit may be an encoding block length.

A length of each symbol in FIG. 2 is referred to as a symbol length, and is generally denoted by E in FEC. The symbol length refers to the amount of data of each symbol, and a unit of the symbol length is, but is not limited to, a bit or a byte.

In FIG. 2, the number of the source symbols in the encoding block unit or the amount of data of the source symbols in the encoding block unit is referred to as a source block length, and is generally denoted by k in FEC. However, the exemplary embodiment is not limited thereto.

According to an exemplary embodiment, the encoding block length, the source block length, and the symbol length are parameters that adjust an FEC encoding rate, that is, an FEC rate. The number of repair symbols that have to be generated per a certain number source symbols may be controlled by adjusting the encoding block length n, the source block length k, and the symbol length E. Signs of the parameters such as n, k, and E are signs generally used by one of ordinary skill in the art, but the exemplary embodiment is not limited thereto.

According to an exemplary embodiment, the term 'source symbol' includes any of various types of source data such as a source packet or a payload, includes any of types in which any of various types of headers such as a real time protocol (RTP) or a symbol ID is added to a source packet, and refers to a type of data that is FEC encoded, but the exemplary embodiment is not limited thereto. The term 'repair symbol' includes a symbol or a packet such as a parity packet, and refers to a type of data that is FEC encoded, but the exemplary embodiment is not limited thereto. The term 'repair symbol' may include any type of data that may be used in order to detect and correct an error including a loss in FEC.

Regarding FIG. 2, in operation 201, a receiving device receives at least one of symbols that constitute an encoding block unit. That is, the transmitting device generates source symbols and repair symbols based on the encoding block unit by using FEC. In response to the transmitting device transmitting the generated source symbols through a network, the receiving device receives at least one of the source symbols and the repair symbols that constitute the encoding block unit.

According to an exemplary embodiment, the symbols that constitute one encoding block unit may include at least one source symbol and at least one repair symbol.

In operation 203, the receiving device extracts information related to parameters from the at least one symbol. The information about the parameters that adjust an FEC encoding rate is included in the at least one of the source symbols and the repair symbols transmitted by the transmitting device. The receiving device may extract the information related to the parameters from the at least one symbol, to know the number of the source symbols and the repair symbols in the received encoding block or the amount of data of each of the symbols.

According to an exemplary embodiment, since the receiving device may accurately know the information related to the parameters that adjust the FEC encoding rate, the receiving device may perform appropriate decoding according to the received parameters. That is, even when the transmitting device changes the FEC encoding rate, the receiving device may extract the information related to the parameters, may directly detect at which rate the transmitted/received data is encoded, and may perform decoding.

Regarding FIG. 2, in response to an encoding rate of symbols of an encoding block that is currently received being different from an encoding rate that has been previously received, the receiving device may change the parameters that are set in a module (not shown) that performs decoding.

According to an exemplary embodiment, the term 'information related to the parameters that adjust the FEC encoding rate' may include encoding block unit length information. The encoding block unit length information refers to information indicating a length of the encoding block unit. Also, the information related to the parameters that adjust the FEC encoding rate may include source block length information and symbol length information. The source block length information and the symbol length information refer to information indicating a source block length and a symbol length.

According to an exemplary embodiment, the information related to the parameters that adjust the FEC encoding rate may be included in a header of each of the repair symbols.

According to an exemplary embodiment, the information related to the parameters that adjust the FEC encoding rate may be included in an RTP header of each of the source symbols.

According to an exemplary embodiment, FEC encoding may include Reed Solomon (RS)-FEC encoding.

In operation 205, the receiving device determines whether an error may be corrected based on the number of symbols with errors. That is, the receiving device determines whether an error occurs in the symbols received by the receiving device, and determines whether the error may be corrected. The term 'error' used herein includes not only a case where an error occurs in data but also a case where data is omitted or lost.

The number of errors which the receiving device may correct varies according to an FEC encoding method. According to an exemplary embodiment, in response to an encoding method based on an RS code being used, source symbols, the number of which is equal to the number of repair packets, may be recovered. In response to an encoding method based on a Hamming code being used, two or more bits in which an error occurs may not be recovered. The fact that the number of errors that may be corrected varies according to an FEC encoding method is well known to one of ordinary skill in the art, and thus a detailed explanation thereof will not be given.

In operation 207, the receiving device transmits feedback information to the transmitting device prior to the symbols that constitute the encoding block unit being completely received, based on whether or not the error may be corrected.

That is, regarding FIG. 2, when the error may be corrected, the receiving device may correct the error and may use the data. However, when the error may not be corrected, the receiving device transmits the feedback information related to the symbols to the transmitting device.

In the related art, a receiving device does not know information related to an encoding block unit length, a source block length, and a symbol length. Since the receiving device may know only some of parameters that adjust an FEC encoding rate or may not know the parameters at all, the receiving device waits until one encoding block unit is completely received or until it reaches a round trip time (RTT), in order to determine whether an error may not be corrected, and then transmits feedback information to a transmitting device.

However, in the exemplary embodiments, since the receiving device knows the information related to the parameters that adjust the FEC encoding rate, the receiving devices does not need to wait until the symbols that constitute the encoding block unit that is being received are completely received. In other words, since the receiving device knows an encoding block unit length and a source block length, in response to a loss great enough not to correct the error occurring while the symbols that constitute one encoding block unit are received, the receiving device may transmit the feedback information to the transmitting device prior to the symbols that constitute the one encoding block unit being completely received.

According to an exemplary embodiment, the term 'feedback information' may include information related to the number of errors or losses that occur in the encoding block unit and content that requests retransmission of the symbols of the encoding block unit.

Also, according to an exemplary embodiment, the term 'feedback information' may include channel state, e.g., a state of a channel, information measured by the receiving device. That is, the receiving device may transmit as the feedback information that estimates a channel state by using information that indicates a state of a network such as a jitter, a signal-to-noise ratio (SNR), a packet loss rate, or an estimated bandwidth.

Figure 3:
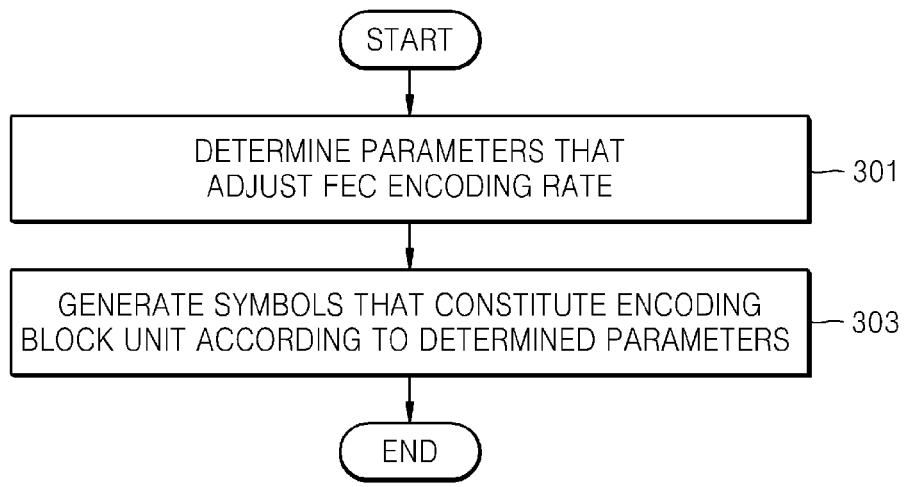
FIG. 3 is a flowchart which illustrates a method of transmitting data by using FEC, according to an exemplary embodiment.

FIG. 3 is a flowchart which illustrates a method of transmitting data by using FEC, according to an exemplary embodiment.

In operation 301, a transmitting device determines parameters that adjust an FEC encoding rate.

According to an exemplary embodiment, the parameters that adjust the FEC encoding rate may include at least one of a symbol length, a source block length, and an encoding block unit length.

Also, according to an exemplary embodiment, in response to parameters that adjust the FEC encoding rate currently used in order to perform FEC encoding being different from parameters that are newly determined, a receiving device may change the parameters set in a module (not shown) that perform the encoding.

Also, according to an exemplary embodiment, information related to the parameters that adjust the FEC encoding rate may be determined based on the feedback information. As described above with reference to FIG. 2, the receiving device may transmit the feedback information to the transmitting device.

According to an embodiment of the present invention, the feedback information may include information related to the number of errors or losses that occur in an encoding block unit, and content that requests for retransmission of symbols of the encoding block unit, and may also include channel state information measured by the receiving device. That is, the receiving device may transmit as the feedback information that estimates a channel state by using information that indicates a state of a network such as a jitter, an SNR, a packet loss rate, or an estimated bandwidth.

In other words, in response to the information related to the parameters that adjust the FEC encoding rate being included in the feedback information, the transmitting device may change the parameters that are set based on the feedback information. In response to the information that estimates the channel state being included in the feedback information, the transmitting device may determine the parameters that adjust the FEC encoding rate based on the information that estimates the channel state.

Even in the middle of a process of transmitting/receiving data through a network between the transmitting device and the receiving device, the transmitting device may determine the information related to the parameters according to the feedback information, and may change the parameters used during an FEC encoding process based on the determined parameters. That is, an immediate response may be made according to a state of a network.

In addition, according to an exemplary embodiment, the receiving device may transmit the feedback information including a retransmission request to the transmitting device, and upon receiving the retransmission request, the transmitting device may process the retransmission request prior to symbols of an encoding block unit being completely transmitted. That is, the transmitting device may process the retransmission request by retransmitting from the beginning the symbols that constitute the encoding block that are currently transmitted or selectively transmitting only the necessary symbols.

According to an exemplary embodiment, in response to the channel state improving (e.g., in response to a packet loss rate being reduced), the transmitting device may not change an encoding block unit length, may increase a source block length, and may increase a symbol length. In response to the channel state not being good (e.g., when the packet loss rate is increased), the transmitting device may determine the parameters by increasing the encoding block unit length, not changing the source block length, and reducing the symbol length.

In operation 303, the transmitting device generates the symbols that constitute the encoding block unit, according to the parameters determined in operation 301.

According to an exemplary embodiment, the transmitting device performs FEC encoding according to the encoding block unit. That is, the transmitting device generates repair symbols according to the number of source symbols. The generating of the repair symbols according to the number of the source symbols includes performing FEC encoding on the encoding block unit.

The number of the source symbols and the repair symbols in one encoding block unit is referred to as an encoding block length, and is generally denoted by n in FEC. The exemplary embodiments are not limited to the number of the source symbols and repair symbols, and a total amount of data in the encoding block unit may be an encoding block length. According to an exemplary embodiment, a length of each symbol is referred to as a symbol length, and the number of the source symbols in the encoding block unit or the amount of data of the source symbols in the encoding block unit is referred to as a source block length, as described above with reference to FIG. 2.

According to an exemplary embodiment, a header may be added to each of the generated source symbols and repair symbols according to the type of each of the symbols. A structure of the header will be explained below, in detail, with reference to FIGS. 4 through 6. Also, regarding FIG. 3, an RTP header may be included in data that is divided prior to the symbols being generated, a data packet, and each of the generated source symbols.

According to an exemplary embodiment, the information related to the parameters that adjust the FEC encoding rate may be included in the generated symbols. That is, according to an exemplary embodiment, the information related to the parameters may be included in an RTP of each of the source symbols and/or a header of each of the repair symbols.

According to an exemplary embodiment, FEC encoding may include RS-FEC encoding.

Figure 4:
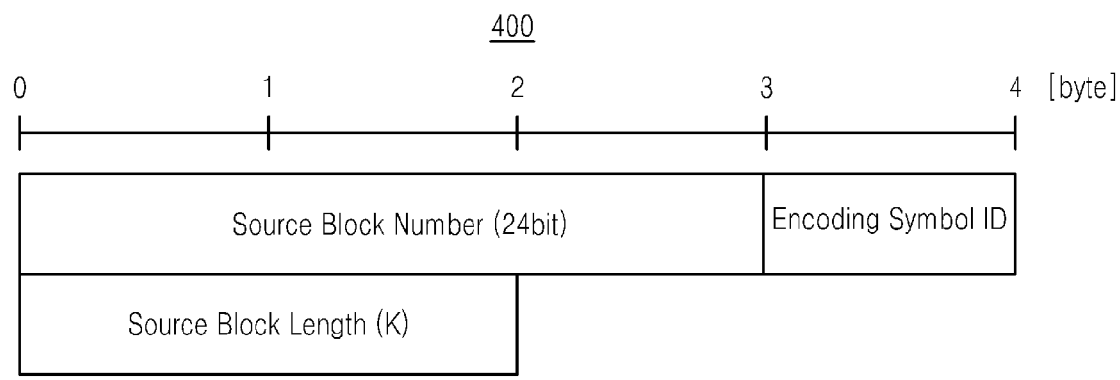
FIG. 4 is a diagram which illustrates a structure of a header of a source symbol, according to an exemplary embodiment.

FIG. 4 is a diagram illustrating a structure of a header of a source symbol, according to an exemplary embodiment.

According to an exemplary embodiment, the header of the source symbol may be added in a process of performing FEC encoding. Although the header of the source symbol has a size of 4 bytes in FIG. 4, the exemplary embodiments are not limited thereto.

According to an exemplary embodiment, the header of the source symbol may include information related to a source block number, an encoding symbol ID, and a source block length.

According to an exemplary embodiment, the source block number indicates from which source block the source symbol is generated. That is, a transmitting device divides data in units of source blocks, and performs FEC encoding on the source block to generate at least one symbol that constitutes an encoding block unit. The transmitting device may indicate from which source block the source symbol is generated by using the source block number. Although the source block number has a size of 24 bits in FIG. 4, the present embodiment is not limited thereto, and the source block number may have a size of 16 bits.

According to an exemplary embodiment, the encoding symbol ID identifies a symbol in the encoding block unit. In other words, the encoding symbol ID may identify at least one symbol constituting the encoding block unit. Although the encoding symbol ID has a size of 8 bits in FIG. 4, the exemplary embodiments are not limited thereto, and the encoding symbol ID may have a size of 16 bits.

According to an exemplary embodiment, the source block length is information indicating the amount of data of source symbols or the number of the source symbols from among the symbols that constitute the encoding block unit as described above with reference to FIGS. 2 and 3. Although the encoding symbol ID has a size of 16 bits in FIG. 4, the exemplary embodiments are not limited thereto.

Also, according to an exemplary embodiment, information related to a symbol length and an encoding block unit length may be additionally included in the header of the source symbol.

Figure 5:
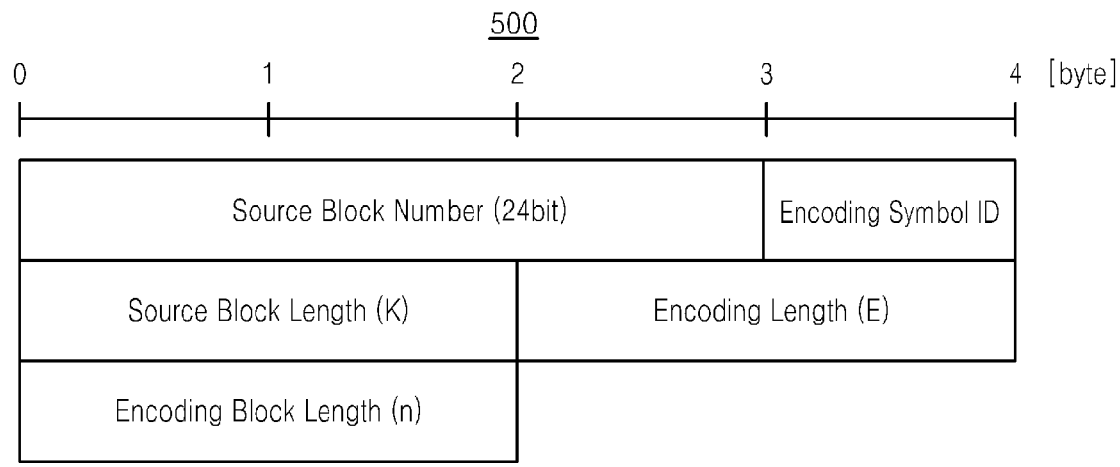
FIG. 5 is a diagram which illustrates a structure of a header of a repair symbol, according to an exemplary embodiment.

FIG. 5 is a diagram which illustrates a structure of a header of a repair symbol, according to an exemplary embodiment.

That is, referring to FIG. 5, information related to parameters that adjust an FEC encoding rate may be included in the header of the repair symbol as well as a header of a source symbol.

According to an exemplary embodiment, the header of the repair symbol may be added to the repair symbol during a process of performing FEC encoding.

According to an exemplary embodiment, the header of the repair symbol may include information related to a source block number, an encoding symbol ID, a source block length, a symbol length, and an encoding block unit length.

According to an exemplary embodiment, as described above with reference to FIG. 4, the source block number indicates from which source block the source symbol is generated. The encoding symbol ID and the source block length are the same as those described above with reference to FIG. 4, and thus a detailed explanation thereof will not be given.

According to an exemplary embodiment, the symbol length indicates the amount of data of symbols that constitute an encoding block unit, as described above with reference to FIGS. 2 and 3, and thus a detailed explanation thereof will not be given.

According to an exemplary embodiment, the encoding block unit length indicates a length of the encoding block unit including source symbols and repair symbols. The encoding block unit length may be referred to as an encoding block length.

According to an exemplary embodiment, since the header of FIG. 5 is added to the repair symbol, a receiving device may know at which rate symbols in the encoding block unit are FEC encoded. The receiving device may efficiently perform decoding by extracting parameters that are included in the header of the repair symbol.

Figure 6:
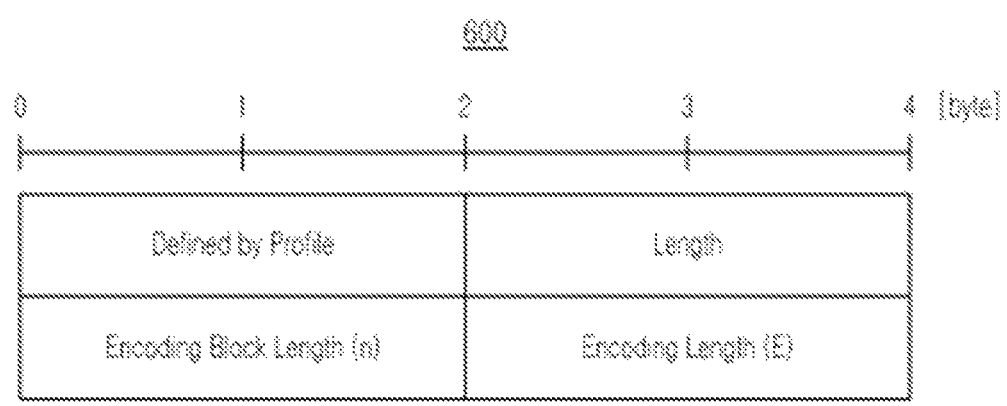
FIG. 6 is a diagram which illustrates a structure of a real time protocol (RTP) header of a source symbol, according to an exemplary embodiment.

FIG. 6 is a diagram which illustrates a structure of an RTP header of a source symbol, according to an exemplary embodiment.

According to an exemplary embodiment, the RTP header of the source symbol may include information defined by a profile, and information related to a length, an encoding block length, and a symbol length. That is, according to an exemplary embodiment, information related to parameters that adjust an FEC encoding rate may be included not only in a header of the source symbol and a header of a repair symbol but also in the RTP header of the source symbol. RTP is a transmission layer communication protocol for transmitting/receiving data in real time which is well known to one of ordinary skill in the art, and thus a detailed explanation thereof will not be given.

The information defined by the profile in FIG. 6 includes information included in the RTP header. The information indicating the length is information which indicates a length of a source packet or the source symbol.

According to an exemplary embodiment, the encoding block length and the symbol length are the same as the encoding block length and the symbol length of FIGS. 4 and 5, and thus a detailed explanation thereof will not be given.

Figure 7:
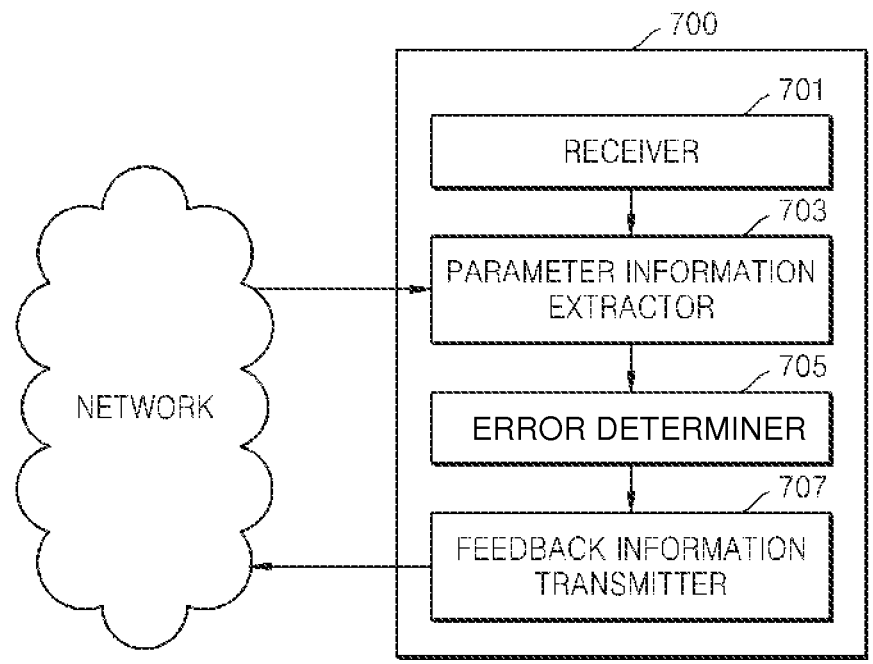
FIG. 7 is a block diagram which illustrates a receiving device according to an exemplary embodiment.

FIG. 7 is a block diagram which illustrates a receiving device 700 according to an exemplary embodiment.

Referring to FIG. 7, the receiving device 700 may include a receiver 701, a parameter information extractor 703, an error determiner 705, and a feedback information transmitter 707.

According to an exemplary embodiment, the receiver 701 receives at least one of symbols that constitute an encoding block unit from a transmitting device 800. The symbols that constitute the encoding block unit may include source symbols and repair symbols.

According to an exemplary embodiment, the parameter information extractor 703 extracts information related to the parameters that adjust an FEC encoding rate from the at least one of the symbols that constitute the encoding block unit. According to an exemplary embodiment, the information related to the parameters may be included in the source symbols and the repair symbols as described above with reference to FIGS. 2 through 6, and may be included in a header of each of the source symbols and the repair symbols.

The receiving device 700 may process the received symbols according to the FEC encoding rate by extracting the parameters that adjust the FEC encoding rate. That is, even when the transmitting device 800 independently changes the FEC encoding rate or an FEC rate without notice or agreement with the receiving device 700, the receiving device 700 may know the FEC encoding rate of the symbols by extracting the parameters that adjust the FEC encoding rate from the symbols in the encoding block unit. Accordingly, the FEC encoding rate may be flexibly adjusted according to a network condition.

According to an exemplary embodiment, the error determiner 705 determines whether an error may be corrected based on the extracted information related to the parameters and the number of symbols with errors from among the symbols that constitute the encoding block unit. However, whether the error occurs and may be corrected may not be determined based only on the number of the symbols, and may be determined according to various error determination methods and error correction methods.

The term 'error' used herein includes not only a case where an error occurs in data but also a case where data is omitted or lost.

According to an exemplary embodiment, the feedback information transmitter 707 may transmit feedback information prior to the symbols that constitute the encoding block unit being completely received according to whether the error may be corrected. In other words, in response to the error determiner 705 determining whether an error occurs in the symbols and determines that the error may be corrected, the receiving device 700 corrects the error in the corresponding data and uses the data. However, in response to the error determiner 705 determining that the error may not be corrected, the receiving device 700 transmits the feedback information related to the symbols to the transmitting device 800.

Since the receiving device 700 knows the information related to the parameters that adjust the FEC encoding rate, the receiving device 700 does not need to wait until the symbols that constitute the encoding block that is being received are all received. In other words, since the receiving device 700 knows an encoding block unit length and a source block length, in response to a loss being great enough not to be recovered or correct the error occurring while the symbols that constitute the one encoding block unit are received, the receiving device 70 may transmit the feedback information to the transmitting device 800 prior to the symbols that constitute the one encoding block unit being completely received.

According to an exemplary embodiment, the term 'feedback information' may include information related to the number of errors or losses that occur in the encoding block unit, and content that requests for retransmission of the symbols of the encoding block unit.

According to an exemplary embodiment, the term 'feedback information' may include channel state information measured by the receiving device 700, and may include, but is not limited to, information indicating a state of a network such as a jitter, an SNR, a packet loss rate, or an estimated bandwidth, as described above with reference to FIG. 2.

In addition, according to an exemplary embodiment, the receiving device 700 may further include a decoder (not shown). For example, the decoder may include the parameter information extractor 703 and the error determiner 705. The decoder of FIG. 7 may perform FEC decoding. The decoder of FIG. 7 may include an FEC decoder, and the receiving device 700 of FIG. 7 may include an FEC framework (not shown) for using various FEC methods.

Also, according to an exemplary embodiment, the receiving device 700 may include a channel state measurer (not shown). The channel state measurer may measure a state of the network.

Figure 8:
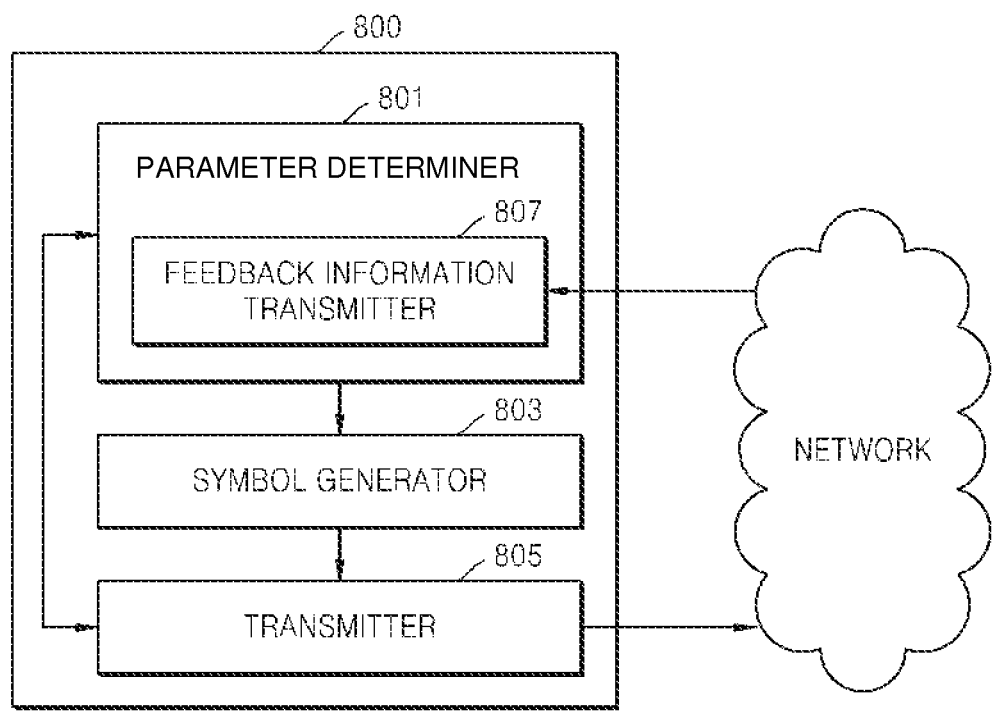
FIG. 8 is a block diagram which illustrates a transmitting device according to an exemplary embodiment.

FIG. 8 is a block diagram which illustrates the transmitting device 800 according to an exemplary embodiment.

In FIG. 8, the transmitting device 800 may include a parameter determiner 801, a symbol generator 803, and a transmitter 805.

According to an exemplary embodiment, the parameter determiner 801 determines parameters that adjust an FEC encoding rate. As described above, the parameters that adjust the FEC encoding rate may include an encoding unit block length n, a symbol length E, and a source block length k.

According to an exemplary embodiment, the parameter determiner 801 may further include a feedback information transmitter 807 that receives feedback information from the receiving device 700. The term 'feedback information' may include at least one from among channel state information, information related to the number of errors or losses that occur in an encoding block unit, information related to the parameters that are to be changed in response to the receiving device 700 adjusting the FEC encoding rate, and information that requests for retransmission of symbols of the encoding block unit.

According to an exemplary embodiment, the parameter determiner 801 may independently determine the parameters or may determine the parameters based on the information received through the feedback information transmitter 807.

According to an exemplary embodiment, the symbol generator 803 generates the symbols that constitute the encoding block unit according to the parameters determined by the parameter determiner 801. According to an exemplary embodiment, a method of generating the symbols that constitute the encoding block unit uses FEC encoding. Alternatively, a method of generating the symbols that constitute the encoding block unit uses RS-FEC encoding.

Information related to the parameters that adjust the FEC encoding rate is included in the symbols. In other words, regarding FIG. 8, at least one of encoding block unit length information, source block length information, and symbol length information may be included in the symbols. Regarding FIG. 8, the information related to the parameters may be included in at least one of a header of each of source symbols, a header of each of repair symbols, and an RTP header of each of the source symbols.

The symbol generator 803 of FIG. 8 may include an encoder (not shown), or the encoder may include the symbol generator 803.

According to an exemplary embodiment, the transmitting device 800 includes the transmitter 805. The transmitter 805 transmits the symbols generated by the symbol generator 803 to the receiving device 700 through a network. In FIG. 8, the transmitter 805 transmits the symbols that are FEC encoded to the receiving device 700.

The exemplary embodiments may be embodied as computer-readable codes in a computer-readable recording medium. The computer-readable recording medium may be any recording apparatus capable of storing data that is read by a computer system. Examples of the computer-readable medium include storage media such as magnetic storage media (e.g., read only memories (ROMs), floppy discs, or hard discs), optically readable media (e.g., compact disk-read only memories (CD-ROMs), or digital versatile disks (DVDs)), etc. The computer readable recording medium may be distributed among computer systems that are interconnected through a network, and the exemplary embodiments may be stored and implemented as computer readable codes in the distributed system. While the exemplary embodiments have been particularly shown and described, the exemplary embodiments and terms have merely been used to explain the present invention and should not be construed as limiting the scope of the present invention as defined by the claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A data communication method for performing data communication according to a state of a network using forward error correction (FEC) in a data receiving apparatus, the data communication method comprising:
   receiving, by the data receiving apparatus, at least one of symbols that constitute one encoding block unit, from a data transmitting apparatus through the network;
   extracting, by the data receiving apparatus, from the at least one symbol, information related to parameters that represent an FEC encoding rate determined by the data transmitting apparatus;
   determining, by the data receiving apparatus, whether an error may be corrected based on the extracted information and a number of symbols with errors from among the symbols that constitute the encoding block unit while the symbols are received;
   changing, by the data receiving apparatus, the parameters for adjusting the FEC encoding rate based on the determining; and
   transmitting, by the data receiving apparatus, feedback information related to the changed parameters prior to the symbols that constitute the encoding block unit being completely received based on the determining, to the data transmitting apparatus through the network,
   wherein the feedback information includes a channel state information measured by the data receiving apparatus based on information indicating the state of the network, and
   wherein the parameters comprise at least one of encoding block unit length information, source block length information and symbol length information.

2. The data communication method of claim 1, wherein the symbols that constitute the encoding block unit comprise at least one source symbol and at least one repair symbol.

3. The data communication method of claim 2, wherein the information related to the parameters is included in a header of the at least one repair symbol.

4. The data communication method of claim 1, wherein the information related to the parameters is included in a real time protocol (RTP) header of the at least one symbol.

5. The data communication method of claim 1, wherein the FEC is a Reed Solomon (RS)-FEC.

6. The data communication method of claim 1, wherein the feedback information comprises at least one of a retransmission request of the symbols of the encoding block unit or channel state information.

7. A communication apparatus for performing data communication according to a state of a network using forward error correction (FEC), the communication apparatus comprising:
   a memory storing instructions: and
   a processor configured to execute the stored instructions to:
   receive at least one of symbols that constitute one encoding block unit, from a data transmitting apparatus through the network;
   extract information related to parameters that represent an FEC encoding rate determined by the data transmitting apparatus from the at least one symbol;
   determine whether an error may be corrected based on the extracted information and a number of symbols with errors from among the symbols that constitute the encoding block unit while the symbols are received; and
   change the parameters for adjusting the FEC encoding rate based on the determining; and
   a transmitter configured to transmit feedback information related to the changed parameters prior to the symbols that constitute the encoding block unit being completely received based on the determining, to the data transmitting apparatus through the network, wherein the feedback information includes a channel state information measured by the communication apparatus based on information indicating the state of the network, and wherein the parameters comprise at least one of encoding block unit length information, source block length information and symbol length information.

8. The communication apparatus of claim 7, wherein the symbols that constitute the encoding block unit comprise at least one source symbol and at least one repair symbol.

9. The communication apparatus of claim 8, wherein the information related to the parameters is included in a header of the at least one repair symbol.

10. The communication apparatus of claim 7, wherein the information related to the parameters is included in a real time protocol (RTP) header of the at least one symbol.

11. The communication apparatus of claim 7, wherein the FEC is a Reed Solomon (RS)-FEC.

12. The communication apparatus of claim 7, wherein the feedback information comprises at least one of a retransmission request of the symbols that constitute the encoding block unit or channel state information.

13. A non-transitory computer-readable recording medium having embodied thereon a program, wherein the program, when executed by a processor of a computer, causes the computer to execute the data communication method of claim 1.

* * * * *